(12) United States Patent
Lee

(10) Patent No.: US 7,290,227 B2
(45) Date of Patent: Oct. 30, 2007

(54) METHOD OF CALIBRATING SEMICONDUCTOR LINE WIDTH

(75) Inventor: Jun Seok Lee, Goyang (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/024,755

(22) Filed: Dec. 30, 2004

(65) Prior Publication Data

US 2005/0144579 A1    Jun. 30, 2005

(30) Foreign Application Priority Data

Dec. 31, 2003  (KR) .................. 10-2003-0101770

(51) Int. Cl.
*G06F 17/50* (2006.01)
(52) U.S. Cl. ............................. 716/4; 716/19
(58) Field of Classification Search .......... 716/2, 716/4–5, 21, 19
See application file for complete search history.

(56) References Cited

U.S. PATENT DOCUMENTS

| | | | |
|---|---|---|---|
| 2002/0091985 A1* | 7/2002 | Liebmann et al. | 716/19 |
| 2003/0061595 A1* | 3/2003 | Ki et al. | 716/21 |
| 2004/0131977 A1* | 7/2004 | Martyniuk et al. | 430/311 |
| 2004/0212793 A1* | 10/2004 | Koizumi et al. | 355/67 |

FOREIGN PATENT DOCUMENTS

KR    1020030039599    5/2003

\* cited by examiner

*Primary Examiner*—Paul Dinh
*Assistant Examiner*—Suresh Memula
(74) *Attorney, Agent, or Firm*—Lowe Hauptman Ham & Berner LLP

(57) ABSTRACT

A method of calibrating a line width in a semiconductor device including fitting line width CD (critical dimension) data to a log function by measuring the line width CD data to plot selectively according to a space size in mask design, fabrication, and correction and applying an output value of the log function as a mask fabrication line width bias by selectively inputting a space value.

8 Claims, 8 Drawing Sheets

METHOD OF CALIBRATING SEMICONDUCTOR LINE WIDTH

BACKGROUND OF THE INVENTION

1. Field of the Invention

The present invention relates to a method of calibrating a semiconductor line width, by which an irregular line width bias generated from exposure and etch in semiconductor fabrication is accurately corrected.

2. Discussion of the Related Art

Generally, a photomask pattern directly affects the precision of a real pattern formed on a semiconductor substrate. If an optical proximity effect of the photomask pattern fails to be correctly taken into consideration, a pattern line width is distorted from the intended exposure of the photolithography. Hence, line width linearity is shortened, degrading the semiconductor device characteristics.

In semiconductor photolithography, a precise design of a photomask enables a quantity of light transmitted via the photomask to be appropriately adjusted. For the precise design of the photomask, OPC, phase shift masking, and the like has been proposed, as well as various methods for minimizing the light distortion attributed to a shape of the pattern drawn on a mask.

Lately, a chemically amplified resist having excellent sensitivity to far infrared ray wavelength (248-194 nm) has been developed to substantially enhance resolution. The resolution enhancement is attributed to the technique of forming a supplementary (dummy) pattern separated from a primary pattern to control an optical proximity effect.

The most important fact is to lower a bias between a line width CD (critical dimension) and a design CD according to an exposure machine. The bias between the CDs tends to occur optically. A micro loading effect between patterns takes place via an etch process. The CD bias problem is attributed to byproducts such as polymers and the like.

The former line width bias is called development image (DI) CD bias and the latter line width bias is called final image (FI) CD bias.

The DI CD bias is predictable by a program copy method which generates a model capable of predicting a bias correction method. On the other hand, the FI CD bias is difficult to predict by the program copy method. Specifically, since the FI CD bias is represented by expressions of chemical composition and reaction, it is difficult to produce reproducible and correct results. Moreover, the FI CD bias tends not to follow the tendency of the DI CD, instead showing a new tendency. Hence, it is very difficult to generate a FI CD pattern forming model.

FIG. 1 shows a calibration mask having line widths adjusted by step in a semiconductor fabrication method according to a related art. A general illumination system having 248 nm DUV scanner, 0.65 N.A., and 0.55 sigma as exposure conditions and in which 'TOK-P028 750 nm' is used as photoresist for spin coating.

Referring to FIG. 1, a mask consists of a plurality patterns of isolated line parts 1A, 2A, and 3A, an isolated face part 30A, and dense line parts 1B-1C and 2B-2C adjusted by pitch. The pitch adds a line and space.

FIG. 2 is an exemplary graph of plotted line width pitches in FIG. 1 based on DI CD and FI CD exposed via the mask in FIG. 1.

A DI CD error 5 is a value plotted per pitch for a value resulting from subtracting a design CD from a DI CD exposed and developed via the corresponding mask.

A FI CD error 6 is a value plotted per pitch for a value resulting from subtracting a design CD from a line width CD after the completion of the etching.

Moreover, a design CD error 4 corresponds to a reference line. A line width bias A-B between the corresponding DI and FI CDs has no fixed difference according to a pitch.

In other words, DI 5A and FI 6A considerably differ from each other in tendency at 1,000 nm pitch. As the pitch increases, FI CD 6B keeps increasing but DI CD 6A becomes saturated.

Therefore, it is important to express the tendency of FI CD by numerical formula.

SUMMARY OF THE INVENTION

Accordingly, the present invention is directed to a method of calibrating a semiconductor line width that substantially obviates one or more problems due to limitations and disadvantages of the related art.

The present invention advantageously provides a method of calibrating a semiconductor line width, by which an irregular line width bias generated from exposure and etching in semiconductor fabrication is accurately corrected.

The present invention also advantageously provides a method of calibrating a semiconductor line width, by which FI bias for design CD is automatically and accurately found in a manner of expressing FI CD appearing from chemical reaction by a mathematical function based on a space instead of a pitch in real data fitting in semiconductor fabrication and by which an OPC bias correction value is facilitated to be found via prediction of the FI CD.

The present invention further provides a method of calibrating a semiconductor line width, by which trial & error costs and process test costs in semiconductor fabrication are reduced to lower a manufacturing cost of a wafer.

Additional advantages, objects, and features of the invention will be set forth in part in the description which follows and in part will become apparent to those having ordinary skill in the art upon examination of the following. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of calibrating a semiconductor line width according to the present invention includes the steps of fitting line width CD (critical dimension) data into a log function by measuring the line width CD data to plot selectively according to a space size in mask design, fabrication, and correction and applying an output value of the log function as a mask fabrication line width bias wherein the output value is obtained by inputting the space size.

In one exemplary embodiment, in the fitting step, a gap between a DI (development image) CD bias and a design CD and a gap between a FI (final image) CD bias and the design CD are fitted to facilitate bias correction between the DI CD and the FI CD.

In one exemplary embodiment, the fitting step includes the steps of generating an optimal model by correcting a design CD to measurement DI CD value of a prescribed line width with an optical model per pitch, expressing a DI CD error and an FI CD error of isolated and dense lines per line width linearity, plotting the FI CD error according to a space by comparing a CD error between the FI CD and the design CD based on a log function tendency of a CD of the dense line, and fitting the CD data into the log function by numerical analysis using the plotted measurement data.

In one exemplary embodiment, in the mask fabrication line width bias applying step, a bias correction value for a target CD is checked by calculating an Fl CD error value by inputting the space size to the log function.

In one exemplary embodiment, the method further includes the step of if space sections are unable to be entirely fitted into one log function, expressing the space sections by a divided log function.

It is to be understood that both the foregoing general description and the following detailed description of the present invention are exemplary, but are not restrictive of the invention.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to exemplary embodiments of the present invention, which are illustrated in the accompanying drawings. Wherever possible, the same reference numbers will be used throughout the drawings to refer to the same or like parts.

Figure 1:
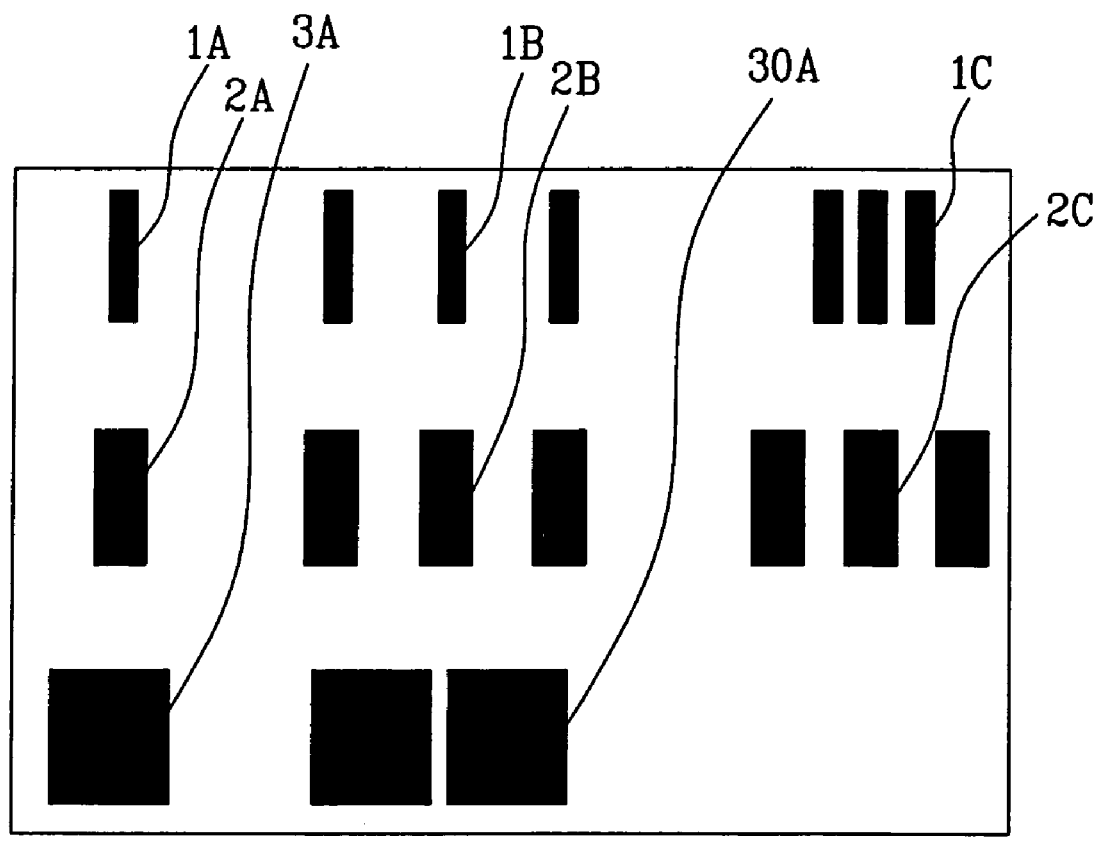
FIG. 1 shows a calibration mask having line widths adjusted by step in a semiconductor fabrication method according to a related art.
Figure 2:
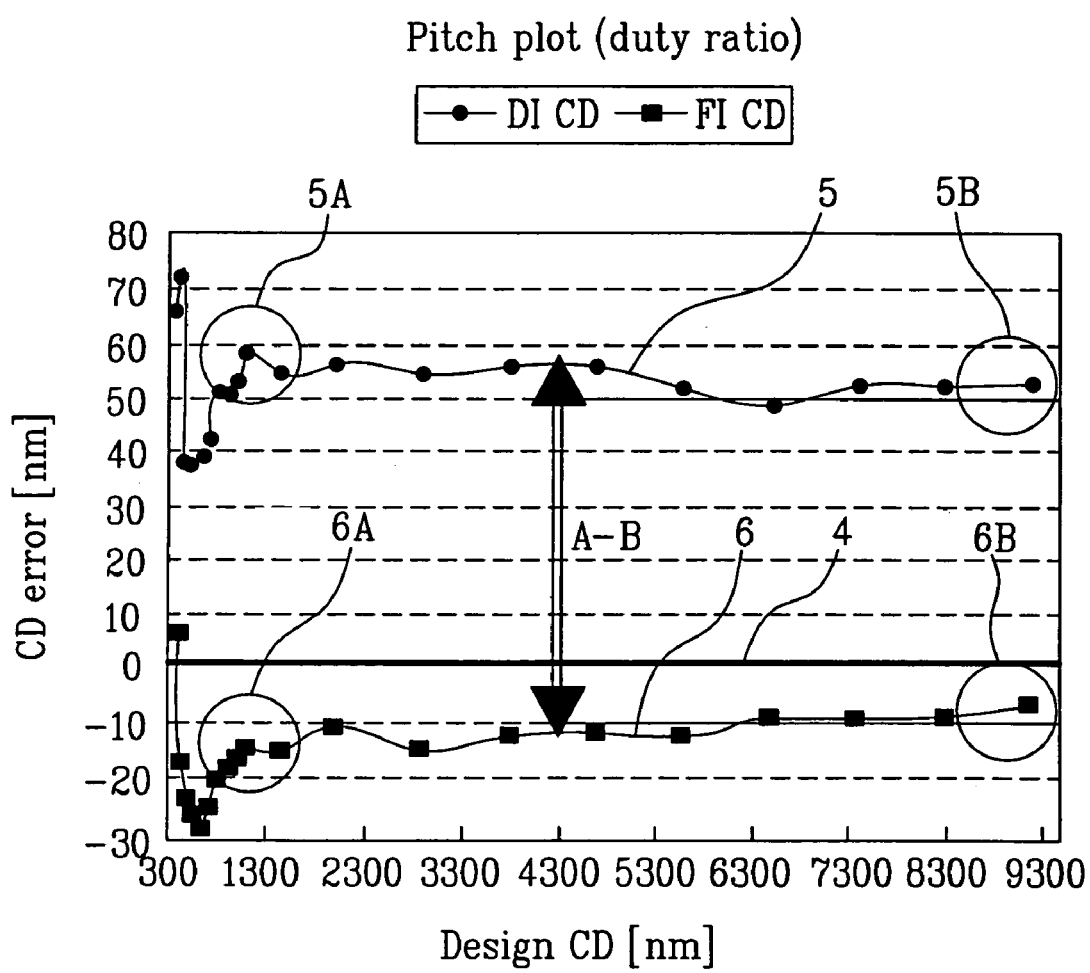
FIG. 2 is an exemplary graph of plotted line width pitches in FIG. 1.
Figure 3:
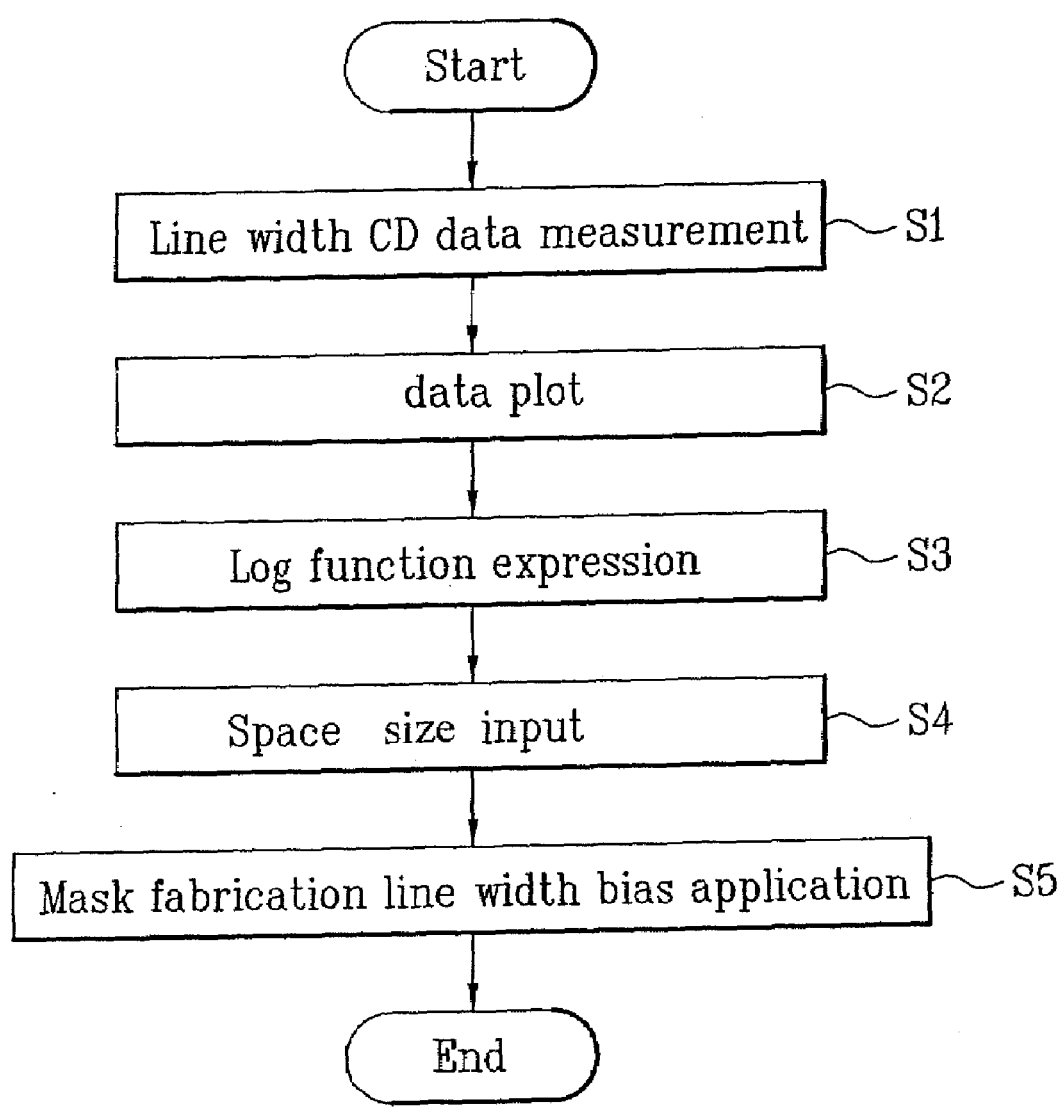
FIG. 3 is a flowchart of a method of calibrating a semiconductor line width according to an embodiment of the present invention.

FIG. 3 is a flowchart of a method of calibrating a semiconductor line width according to an embodiment of the present invention.

Referring to FIG. 3, in design, fabrication, and correction of a mask, line width CD data adjusted by uniform interval are measured (S1), the measured line width CD data are selectively plotted according to a space size which is distance between patterns (S2), and the plotted measurement data values are then expressed by a log function (S3).

Subsequently, a space size is selectively inputted (S4) and an output value of the log function is then applied as a mask fabrication line width bias (S5).

Meanwhile, in the method of calibrating the semiconductor line width according to the embodiment of the present invention, a gap between DI CD bias and design CD and a gap between FI CD and design CD are fitted to an equation to facilitate bias correction between DI CD and FI CD, which is explained as follows for example.

Figure 4:
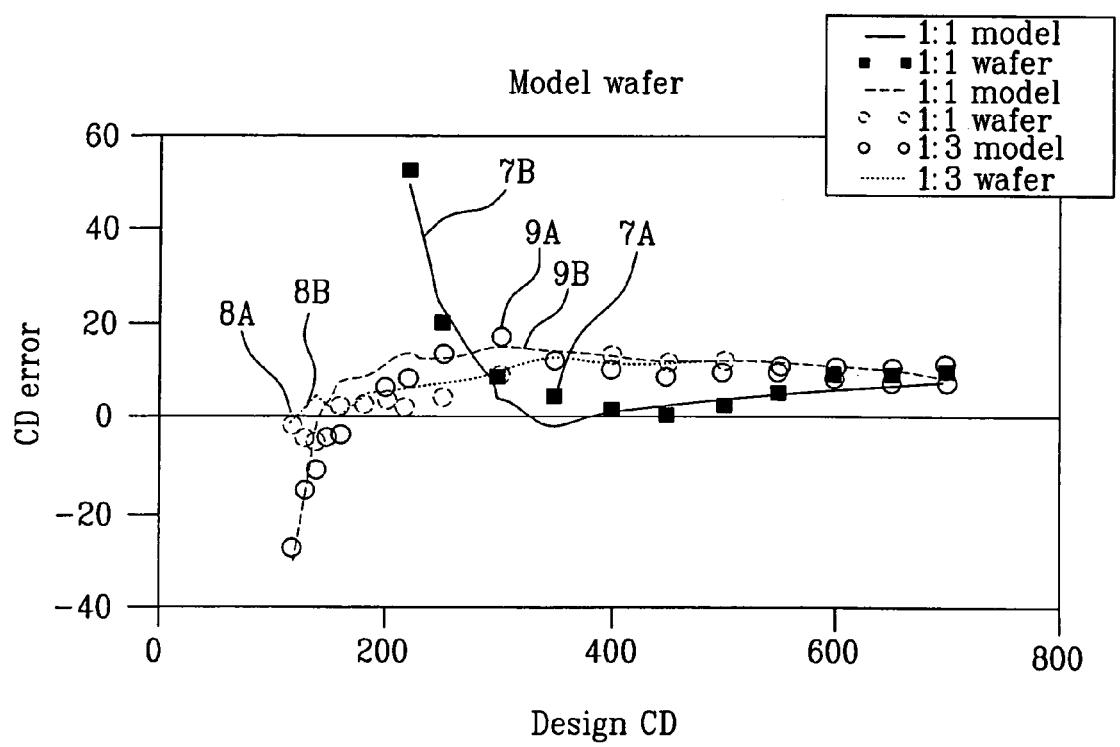
FIG. 4 is a graph of design CD corrected by optical model to measured DI (development image) CD.

FIG. 4 is a graph of design CD corrected by optical model to measured DI (development image) CD for a prescribed length (0.18 μm) per pitch.

Referring to FIG. 4, line width design values 7B, 8B, and 9B and real measurement values 7A, 8A, and 9A for 1:1 pitch (0.18 line vs. 0.18 space), 1:2 pitch (0.18 line vs. 0.36 space), and 1:3 pitch (0.18 line vs. 0.54 space) are simultaneously shown. After completion of the optimal model, the following procedures are executed to calculate a final FI CD bias value.

Figure 5:
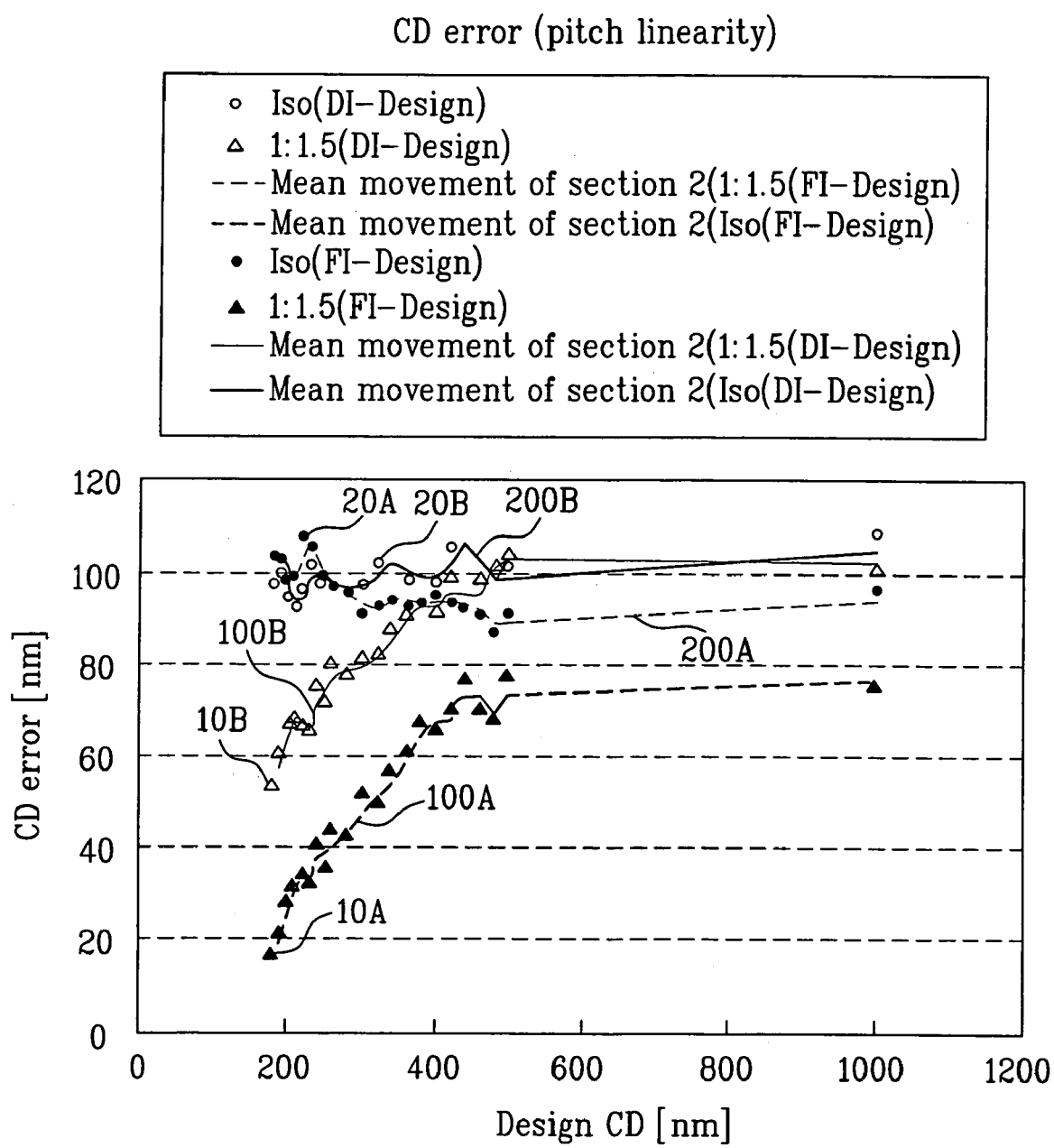
FIG. 5 is a graph of DI CD and FI (final image) CD errors in isolated and dense lines in FIG. 3.

FIG. 5 is a graph of DI CD and FI (final image) CD errors in isolated and dense lines (1:1.5 pitch) in FIG. 3.

Referring to FIG. 5, DI CD error 20B or FI CD error 20A tends toward a relatively horizontal line according to line width linearity. In this case, each solid line 200A or 200B indicates a mean movement value of a data section and each symbol display part 20A or 20B indicates a real measurement CD error.

In moving toward a dense line, a slope gradually goes downward from a line width of a prescribed length (e.g., about 500 nm or below). The CD errors of the symbol display parts, i.e., DI CD error 10B and FI CD error 10A, have a tendency of a log function. In this case, each solid line 100A or 100B indicates a mean movement value of a data section and each symbol display part 10A or 10B indicates a real measurement CD error.

Figure 6:
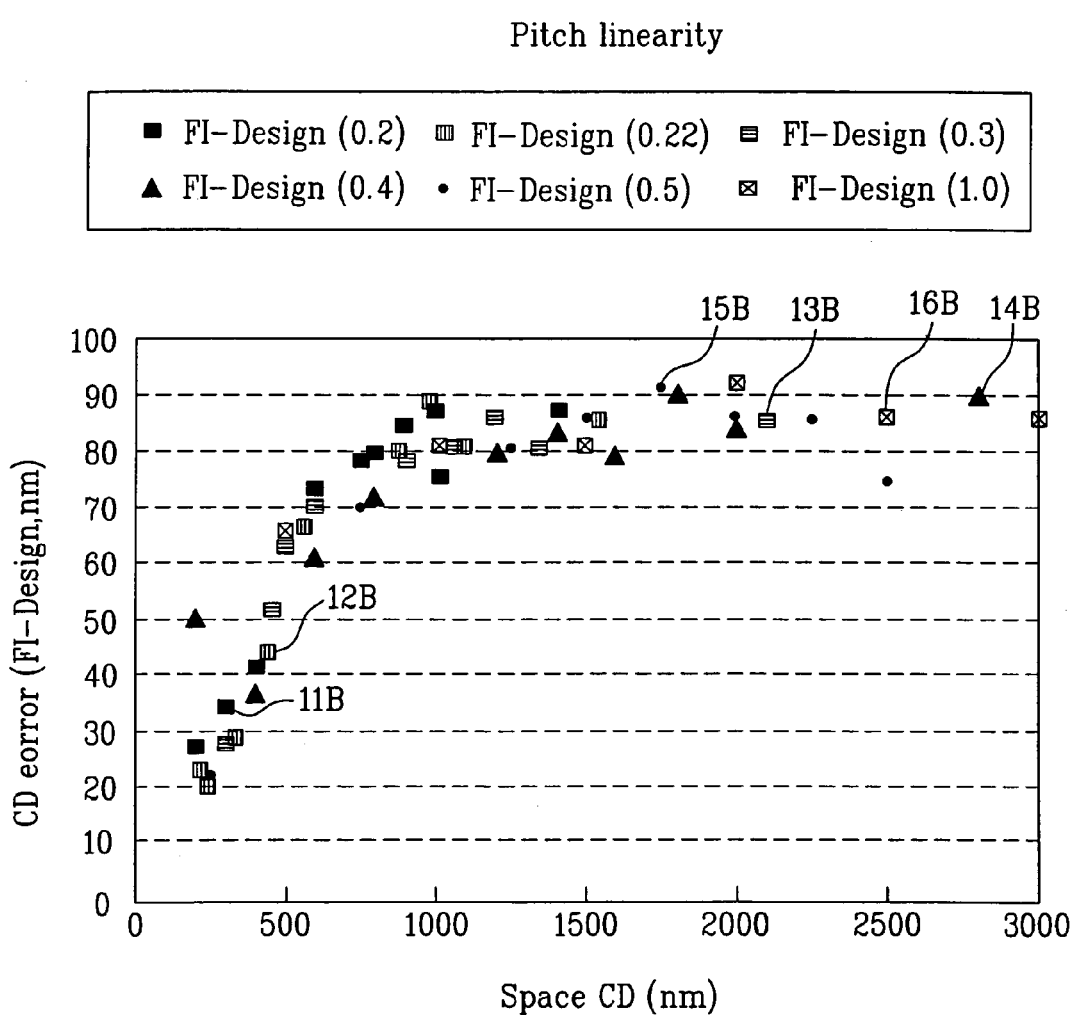
FIG. 6 is a graph of CD errors between FI CD and design CD.

FIG. 6 is a graph of CD errors between FI CD and design CD, in which the log function tendency of the dense line is taken into consideration.

Referring to FIG. 6, FI CD errors having the following line widths are plotted versus space instead of pitch.

All kinds of FI CD error plots are shown in case of line width 0.20 μm 11B, line width 0.22 μm 12B, line width 0.3 μm 13B, line width 0.4 μm 14B, line width 0.5 μm 15B, and line width 1.0 μm 16B. Namely, the graph corresponds to the log function regardless of the line width according to the space overall.

Figure 7:
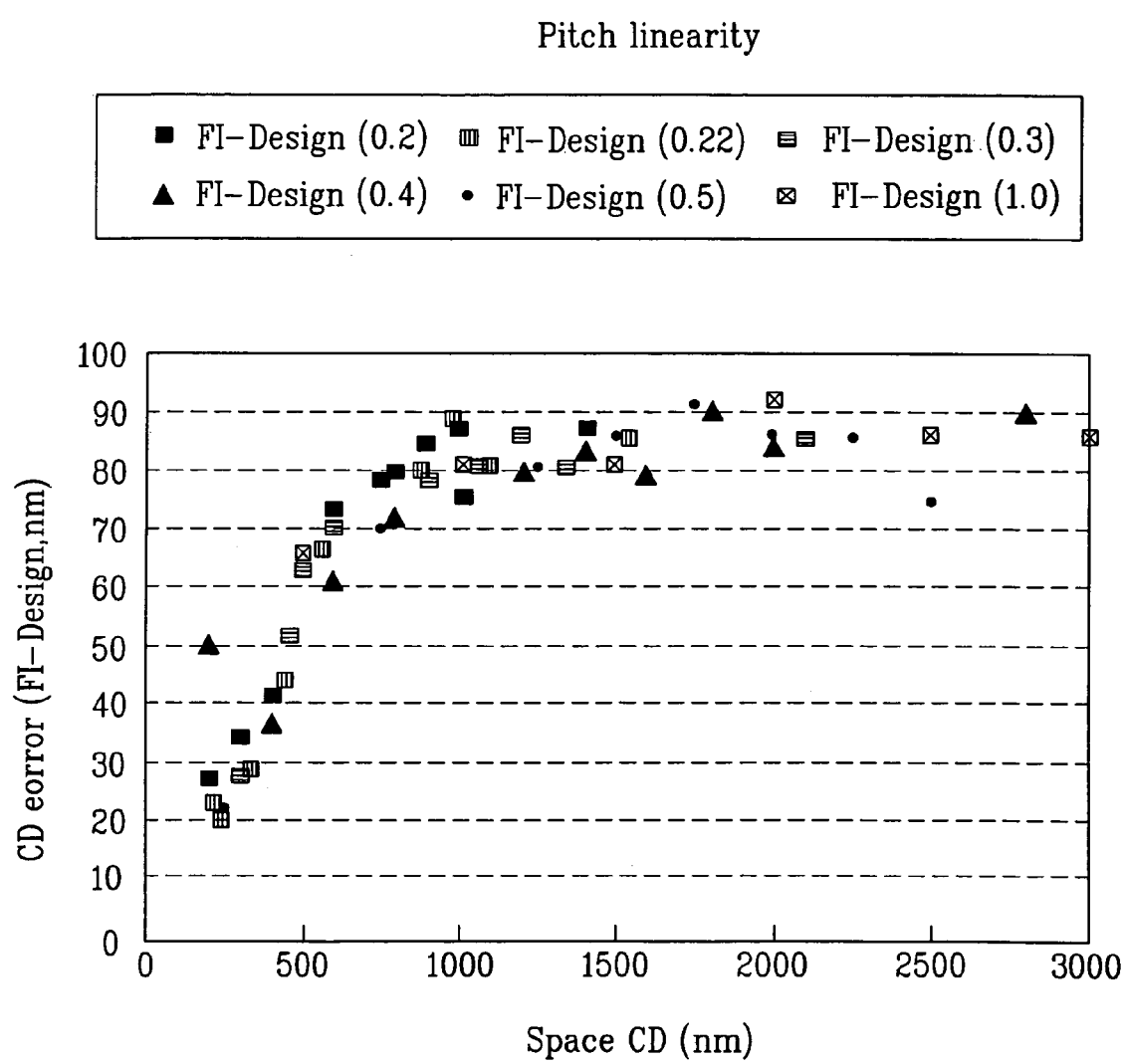
FIG. 7 is a graph of log function for real measurement data values in FIG. 6.

FIG. 7 is a graph of log function for real measurement data values in FIG. 6.

Referring to FIG. 7, a corresponding log function can be easily found by numerical analysis using all real measurement data.

By inputting a space size to the generated log function only, an FI CD error value can be found. Hence, a bias correction value for a target CD can be automatically known.

Alternatively, a method of calibrating a semiconductor line width according to another embodiment of the present invention is explained with reference to FIG. 8 as follows.

Figure 8:
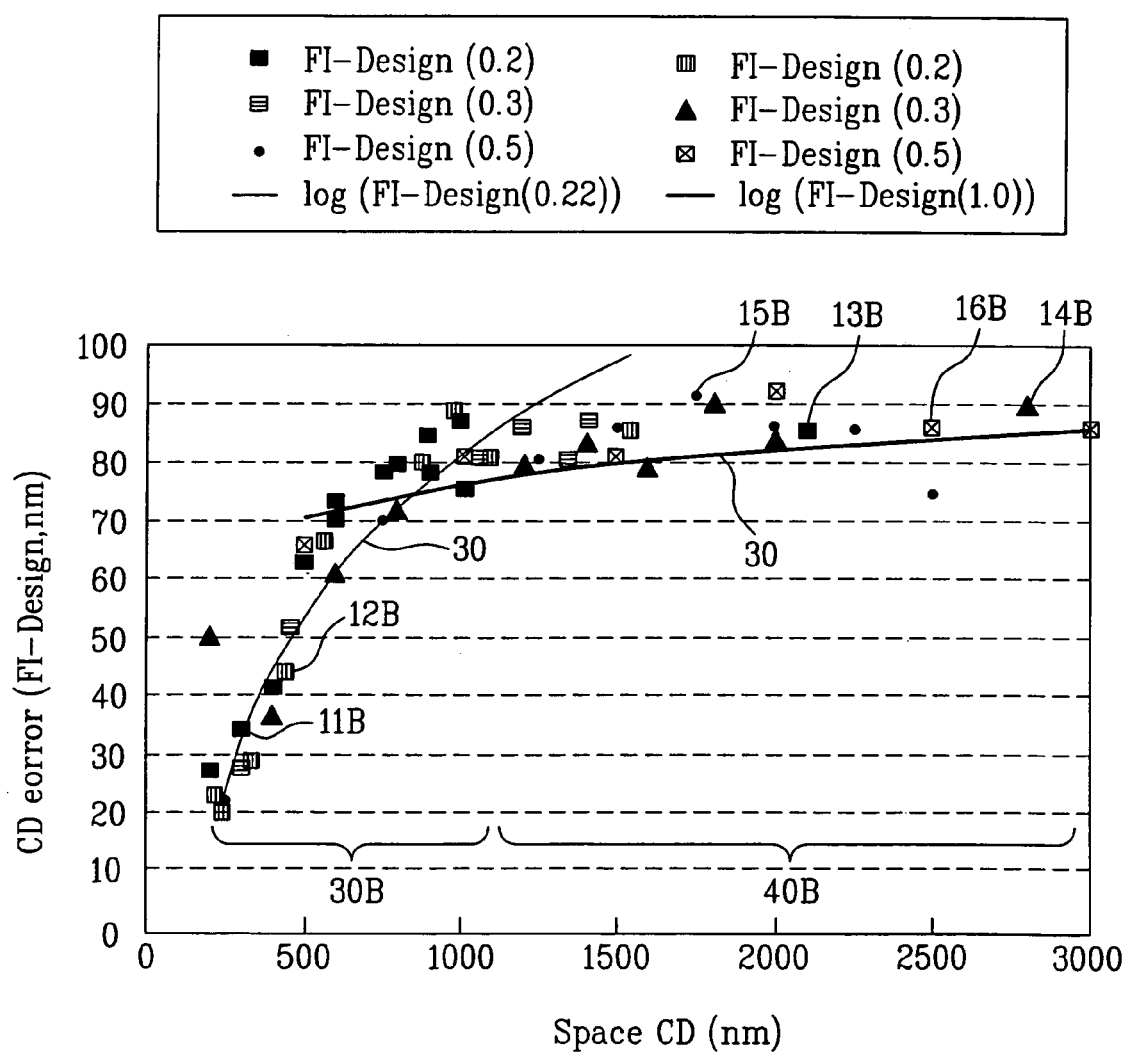
FIG. 8 is a graph of divided log functions for space sections.

FIG. 8 is a graph of divided log functions for space sections.

In case that it is not possible to fit an entire space section to one log function, divided log functions are used. For instance, since a slope of a section 40B for data greater than 1,100 nm, as shown in FIG. 8, tends to be saturated, two corresponding sections are fitted to separate log functions to find a more accurate predictive value.

Consequently, a slope and intercept of the log function will vary. An arbitrary space size within the corresponding section is inputted to find the FI CD error.

Accordingly, in the present invention, FI bias for design CD is automatically and accurately found in a manner of expressing FI CD appearing from chemical reaction by a mathematical function based on a space in real data fitting in semiconductor fabrication and an OPC bias correction value is facilitated to be found via prediction of the FI CD.

Therefore, trial & error costs and process test costs in semiconductor fabrication are reduced, lowering a manufacturing cost of a wafer.

Korean Patent Application No. P2003-0101770, filed on Dec. 31, 2003, is hereby incorporated by reference in its entirety.

It will be apparent to those skilled in the art that various modifications and variations can be made in the present invention. Thus, it is intended that the present invention covers the modifications and variations of this invention within the scope of the appended claims and their equivalents.

What is claimed is:

1. A method of calibrating a semiconductor line width, comprising the steps of:
   fitting line width CD (critical dimension) data to a log function by measuring the line width CD data to plot selectively according to a space size in mask design, fabrication, and correction; and
   applying an output value of the log function as a mask fabrication line width bias, wherein the output value is obtained by inputting the space size to the log funtion;
   wherein the step of fitting line width CD data includes fitting a gap between a DI (development image) CD bias and design CD and a gap between a FI (final image) CD bias and the design CD to an equation to facilitate bias correction between the DI CD and the FI CD.

2. The method of claim 1, wherein the step of fitting line width CD data comprises the steps of:
   generating an optimal model by correcting a design CD to measurement DI CD value of a prescribed line width with an optical model per pitch;
   expressing a DI CD error and an FI CD error of isolated and dense lines per line width linearity;
   plotting the FI CD error according to a space by comparing a CD error between the FI CD and the design CD based on a log function tendency of a CD of the dense line; and
   fitting the CD data to the log function by numerical analysis using the plotted measurement data.

3. The method of claim 1, wherein the step of applying an output value includes checking a bias correction value for a target CD by calculating an FI CD error value by inputting the space size to the log function.

4. The method of claim 1, further comprising the step of expressing space sections with a divided log function if space sections cannot be fitted to one log function.

5. A method of calibrating a semiconductor line width comprising:
   a step for fitting line width CD (critical dimension) data to a log function by measuring the line width CD data to plot selectively according to a space size in mask design, fabrication, and correction; and
   a step for applying an output value of the log function as a mask fabrication line width bias, wherein the output value is obtained by inputting the space size;
   wherein the step for fitting includes a step for fitting a gap between a DI (development image) CD bias and a design CD and a gap between a FI (final image) CD bias and the design CD to an equation to facilitate bias correction between the DI CD and the FI CD.

6. The method of claim 5, wherein the step for fitting comprises:
   a step for generating an optimal model by correcting a design CD to measurement DI CD value of a prescribed line width with an optical model per pitch;
   a step for expressing a DI CD error and an FI CD error of isolated and dense lines per line width linearity;
   a step for plotting the FI CD error according to a space by comparing a CD error between the FI CD and the design CD based on a log function tendency of a CD of the dense line; and
   a step for fitting the CD data to the log function by numerical analysis using the plotted measurement data.

7. The method of claim 5, wherein the step for applying an output value includes a step for checking a bias correction value for a target CD by calculating an FI CD error value by inputting the space size to the log function.

8. The method of claim 5, further comprising a step for expressing space sections by a divided log function if space sections cannot be fitted to one log function.

* * * * *